(12) United States Patent
Choi

(10) Patent No.: US 11,456,046 B2
(45) Date of Patent: Sep. 27, 2022

(54) MEMORY DEVICE AND CLOCK LOCKING METHOD THEREOF

(71) Applicant: Samsung Electronics Co., Ltd., Suwon-si (KR)

(72) Inventor: Hundae Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/225,548

(22) Filed: Apr. 8, 2021

(65) Prior Publication Data

US 2022/0084616 A1 Mar. 17, 2022

(30) Foreign Application Priority Data

Sep. 15, 2020 (KR) .................. 10-2020-0118435

(51) Int. Cl.
*G11C 29/12* (2006.01)
*G11C 29/46* (2006.01)
*G11C 29/36* (2006.01)
*H03L 7/083* (2006.01)
*H03L 7/08* (2006.01)
*H03L 7/081* (2006.01)

(52) U.S. Cl.
CPC ........ *G11C 29/12015* (2013.01); *G11C 29/36* (2013.01); *G11C 29/46* (2013.01); *H03L 7/083* (2013.01); *H03L 7/0807* (2013.01); *H03L 7/0818* (2013.01); *G11C 2029/1202* (2013.01); *G11C 2029/1204* (2013.01)

(58) Field of Classification Search
None
See application file for complete search history.

(56) References Cited

U.S. PATENT DOCUMENTS

| | | | |
|---|---|---|---|
| 6,803,826 B2 | 10/2004 | Gomm et al. | |
| 7,236,028 B1* | 6/2007 | Choi | H03L 7/0818 |
| | | | 327/158 |
| 7,388,415 B2 | 6/2008 | Lee | |
| 7,839,191 B2 | 11/2010 | Takai | |
| 7,873,857 B2 | 1/2011 | Baker et al. | |
| 8,120,397 B2 | 2/2012 | Yun et al. | |
| 9,432,025 B1 | 8/2016 | Khor | |
| 10,530,371 B2* | 1/2020 | Jeon | H03L 7/087 |
| 2003/0030473 A1 | 2/2003 | Lee | |
| 2005/0093594 A1 | 5/2005 | Kim et al. | |
| 2013/0162312 A1 | 6/2013 | Jung et al. | |
| 2013/0249618 A1 | 9/2013 | Kwak et al. | |
| 2014/0002155 A1 | 1/2014 | Park et al. | |
| 2014/0021990 A1 | 1/2014 | Na | |
| 2014/0225651 A1 | 8/2014 | Haerle et al. | |
| 2016/0373119 A1 | 12/2016 | Wei et al. | |

FOREIGN PATENT DOCUMENTS

KR 100422585 B1 3/2004

* cited by examiner

*Primary Examiner* — James G Norman
(74) *Attorney, Agent, or Firm* — Harness, Dickey & Pierce, P.L.C.

(57) ABSTRACT

A clock locking method of a memory device, may include performing an initial locking operation in a delay locked loop circuit before an internal voltage is stabilized, monitoring clock skew between a reference clock and a feedback clock using a window detection circuit after the internal voltage is stabilized, and performing a re-locking operation in the delay locked loop circuit using a dynamic delay control corresponding to the clock skew.

19 Claims, 17 Drawing Sheets

MEMORY DEVICE AND CLOCK LOCKING METHOD THEREOF

CROSS-REFERENCE TO RELATED APPLICATION(S)

This application claims benefit of priority to Korean Patent Application No. 10-2020-0118435 filed on Sep. 15, 2020 in the Korean Intellectual Property Office, the disclosure of which is incorporated herein by reference in its entirety.

BACKGROUND

The present inventive concepts relate to a memory device and a clock locking method thereof.

In general, as semiconductor devices such as a dynamic random access memory (DRAM) increase in speed, a delay locked loop (DLL) circuit may operate separately with a coarse delay line of which a delay resolution is high and a fine delay line of which a delay resolution is low.

SUMMARY

An aspect of the present inventive concepts is to provide a memory device performing relatively rapid clock locking in a power noise situation, and a clock locking method thereof.

According to an aspect of the present inventive concepts, a memory device includes a first delay line configured to delay a reference clock according to a first code value to output a first delayed clock; a second delay line configured to delay the first delayed clock according to a second code value to output a second delayed clock; a first delay line controller configured to generate the first code value according to a first phase difference value or configured to generate the first code value according to a second phase difference value; a second delay line controller configured to generate the second code value according to the second phase difference value; a de-multiplexer configured to output the second phase difference value to one of the first delay line controller and the second delay line controller, in response to a monitor detection signal corresponding to clock skew between the reference clock and a feedback clock; a first phase detector configured to detect the first phase difference value between the reference clock and the feedback clock; a second phase detector configured to detect the second phase difference value between the reference clock and the feedback clock; a clock path configured to receive the second delayed clock and configured to generate an internal clock; an output buffer configured to synchronize with the internal clock to output a data strobe signal; a clock path replica configured to delay the second delayed clock by a delay amount equal to a delay amount of the clock path; and an output buffer replica configured to delay a clock output from the clock path replica by a delay amount equal to a delay amount of the output buffer, to generate the feedback clock.

According to an aspect of the present inventive concepts, a clock locking method of a memory device, includes, performing an initial locking operation in a delay locked loop circuit before an internal voltage is stabilized, monitoring clock skew between a reference clock and a feedback clock using a window detection circuit after the internal voltage is stabilized, and performing a re-locking operation in the delay locked loop circuit using a dynamic delay control corresponding to the clock skew.

According to an aspect of the present inventive concepts, a memory device includes a memory cell array having a plurality of memory cells in which a plurality of word lines and a plurality of bit lines intersect; a row decoder configured to select one of the plurality of word lines in response to a row address; a bit line detection amplifier circuit configured to detect and amplify data from memory cells connected to selected bit lines, among the plurality of bit lines, during a read operation; a column decoder configured to select the selected bit lines, among the plurality of bit lines, in response to a column address; a data input/output device configured to receive data from the bit line detection amplifier circuit during the read operation, and configured to output the received data to an external device in response to a data strobe signal synchronized with an internal clock; a delay locked loop circuit configured to receive a reference clock and configured to generate the internal clock; and a window detection circuit configured to generate a monitor detection signal corresponding to clock skew between the reference clock and a feedback clock.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

In the following, the contents of the present inventive concepts will be described clearly and in detail to the extent that those of ordinary skill in the technical field of the present inventive concepts may easily implement it using the drawings.

In general, a delay locked loop (DLL) of a memory device may perform a coarse locking operation and then a fine locking operation in an initial lock period. Subsequently, when unlocking occurs due to power drop, the DLL may perform a fine locking operation to re-lock the unlocking again. This may increase locking time of the DLL and may decrease a data valid window (tDV).

A DLL of a memory device according to example embodiments of the present inventive concepts may operate a window detection circuit after an initial lock period to monitor a difference in delay between a reference clock and a feedback clock, and activate a coarse locking operation according to a monitoring result. As a result, a memory device according to example embodiments of the present inventive concepts may monitor delay skew corresponding to dynamic power noise, to quickly synchronize clocks, and thus tDV reduction may be solved.

Figure 1:
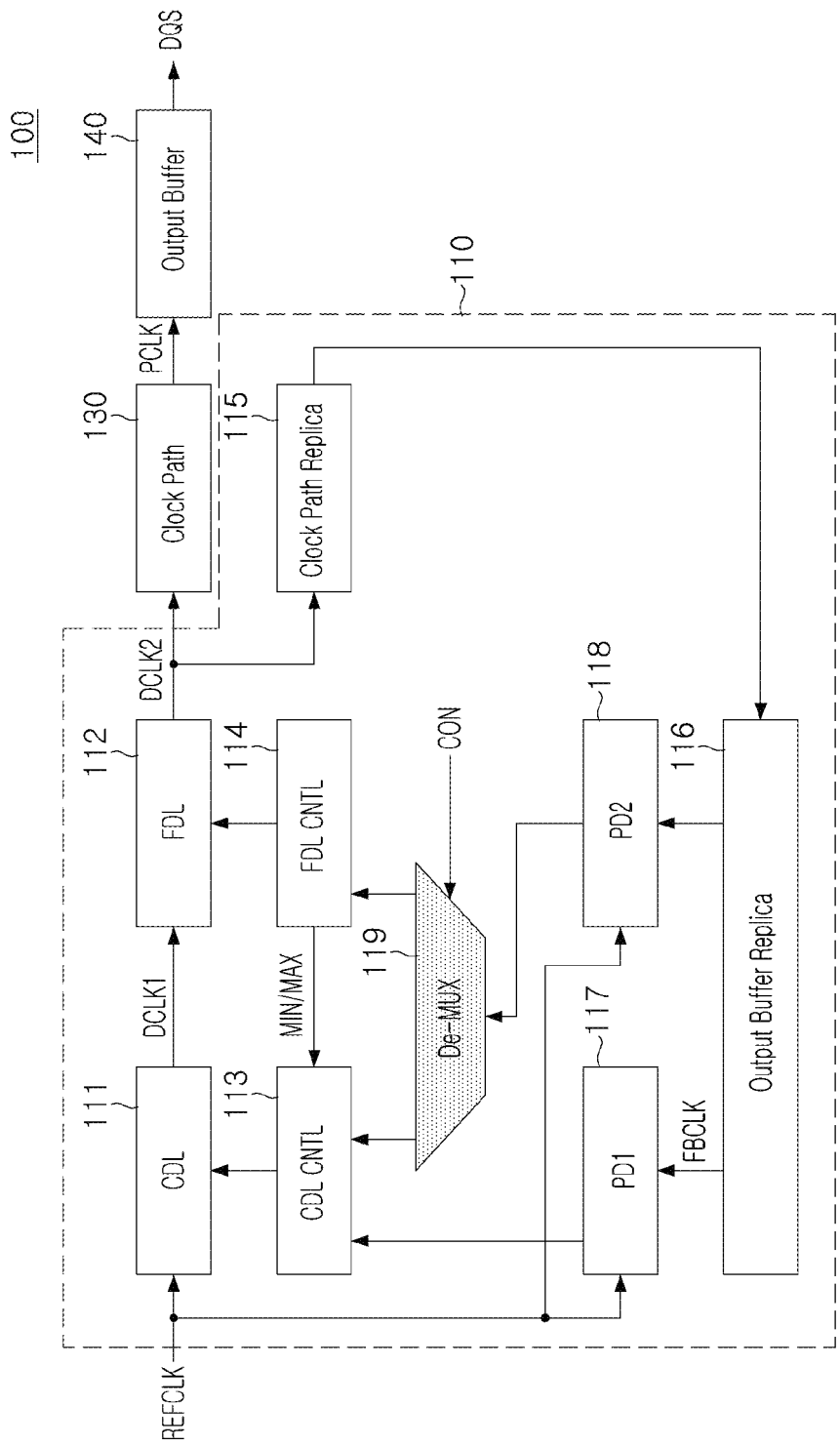
FIG. 1 is a view illustrating a memory device 100 having a delay locked loop (DLL) according to example embodiments of the present inventive concepts.

FIG. 1 is a view illustrating a memory device 100 having a delay locked loop (DLL) according to example embodiments of the present inventive concepts. Referring to FIG. 1, a memory device 100 may include a DLL 110, a clock path 130, and/or an output buffer 140.

The memory device 100 may be implemented to store data received from an external controller or to output read data to the controller. The memory device 100 may be used as an operation memory, a working memory, or a buffer memory in a computing system. In example embodiments, the memory device 100 may be implemented as a single in-line memory module (SIMM), a dual in-line memory module (DIMM), a small-outline DIMM (SODIMM), an unbuffered DIMM (UDIMM), a fully-buffered DIMM (FB-DIMM), a rank-buffered DIMM (RBDIMM), a mini-DIMM, a micro-DIMM, a registered DIMM (RDIMM), or a load-reduced DIMM (LRDIMM).

In example embodiments, the memory device 100 may be implemented as a volatile memory. For example, the volatile memory may include at least one of a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a rambus DRAM (RDRAM), or a static RAM (SRAM). In other example embodiments, the memory device 100 may be implemented as a non-volatile memory. For example, the non-volatile memory may include one of a NAND flash memory, a phase-change RAM (PRAM), a magneto-resistive RAM (MRAM), a resistive RAM (ReRAM), a ferroelectric RAM (FRAM), and a NOR flash memory.

The DLL 110 may include a first delay line (a coarse delay line) 111, a second delay line (a fine delay line) 112, a first delay line controller (CDL CNTL) 113, a second delay line controller (FDL CNTL) 114, a clock pass replica 115, an output buffer replica 116, a first phase detector (PD1) 117, a second phase detector (PD2) 118, and/or a de-multiplexer (De-MUX) 119.

Although not illustrated, the memory device 100 may further include a clock buffer that buffers a clock CK from an external source to generate a reference clock REFCLK.

The first delay line (the coarse delay line) 111 may be implemented to receive the reference clock REFCK and delay the reference clock REFCK according to a first code value, to generate a first delayed clock DCLK1. In example embodiments, the first delay line may include first delay cells connected in series. In example embodiments, each of the first delay cells may have a first delay amount.

The second delay line (the fine delay line) 112 may be implemented to receive the first delayed clock DCLK1 and delay the first delayed clock DCLK1 according to a second code value, to generate a second delayed clock DCLK2. In example embodiments, the second delay line may include second delay cells connected in series. In example embodiments, each of the second delay cells may have a second delay amount. In some example embodiments, the second delay amount may be smaller than the first delay amount.

The first delay line controller (CDL CNTL) 113 may be implemented to generate a first code value corresponding to a first phase difference value or a second phase difference value.

The second delay line controller FDL CNTL 114 may be implemented to generate a second code value corresponding to a second phase difference value.

The clock path replica 115 may be implemented to receive the first delayed clock DCLK2 and to have the same or substantially the same delay amount in the clock path 130.

The output buffer replica 116 may be implemented to delay a clock, output from the clock path replica 115, to the output buffer 140 by the same or substantially the same delay amount, to have a feedback clock FBCLK.

The first phase detector (PD1) 117 may be implemented to generate a first phase difference value according to the feedback clock FBCLK.

The second phase detector (PD2) 118 may be implemented to generate a second phase difference value according to the feedback clock FBCLK.

The de-multiplexer (De-MUX) 119 may be implemented to output a second phase difference value to one of the first delay line controller 113 and the second delay line controller 114 in response to a monitor detection signal CON. In some example embodiments, the monitor detection signal CON may be a signal that monitors delay skew due to dynamic power noise.

The clock path 130 may be implemented to transmit a clock, output from the DLL 110, to the inside of the memory device 100 through internal paths.

The output buffer 140 may be implemented to output a data strobe signal DQS that uses a clock PCLK, output from the clock path 130, to output data.

A memory device 100 according to example embodiments of the present inventive concepts may include a DLL 110 performing a coarse locking operation in response to a monitor detection signal CON that monitors delay skew, to more quickly compensate for delay skew due to power noise.

Figure 2A:
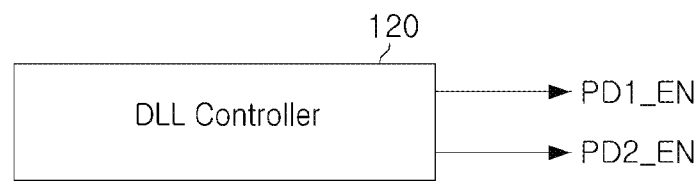
FIGS. 2A and 2B are views illustrating a method of controlling phase detectors PD1 and PD2 of a DLL controller 120 according to example embodiments of the present inventive concepts.
Figure 2B:
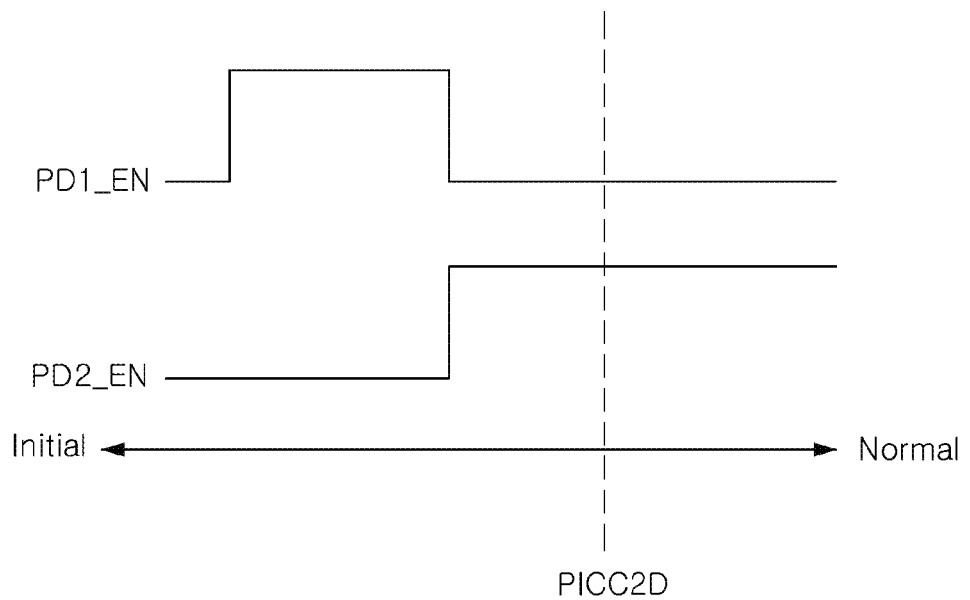

FIGS. 2A and 2B are views illustrating a method of controlling phase detectors PD1 and PD2 of a DLL controller 120 according to example embodiments of the present inventive concepts.

As illustrated in FIG. 2A, a DLL controller 120 may output a first activation signal PD1_EN and a second activation signal PD2_EN to operate complementarily with a first phase detector (PD1) 117 and a second phase detector (PD2) 118 of a DLL 110. The first phase detector 117 may be activated in response to the first activation signal PD1_EN. The second phase detector 118 may be activated in response to the second activation signal PD2_EN.

As illustrated in FIG. 2B, until an internal voltage of a memory device 100 is stabilized (e.g., as determined using PICC2D), the first activation signal PD1_EN may be first in a high level state to perform a coarse locking operation. Then, the second activation signal PD2_EN may be in a high level state to perform a fine locking operation. Thereafter, after stabilizing the internal voltage, the memory device 100 may maintain the second activation signal PD2_EN in a high level state, and may maintain the first activation signal PD1_EN in a low level state. In other example embodiments, after stabilizing the internal voltage, in response to a monitor detection signal CON, the DLL controller 120 may change the second activation signal PD2_EN to a low level state and the first activation signal PD1_EN to a high level state.

Figure 3:
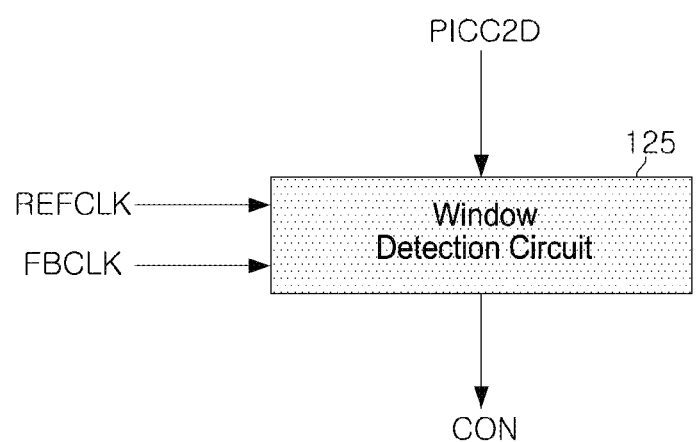
FIG. 3 is a view illustrating a window detection circuit 125 according to example embodiments of the present inventive concepts.

FIG. 3 is a view illustrating a window detection circuit 125 according to example embodiments of the present inventive concepts. Referring to FIG. 3, a window detection circuit 125 may receive an internal voltage stabilization signal PICC2D, and may be implemented to generate a monitor detection signal CON, when delay skew between a reference clock REFCLK and a feedback clock FBCLK exceeds a predetermined or alternatively, desired value.

Figure 4:
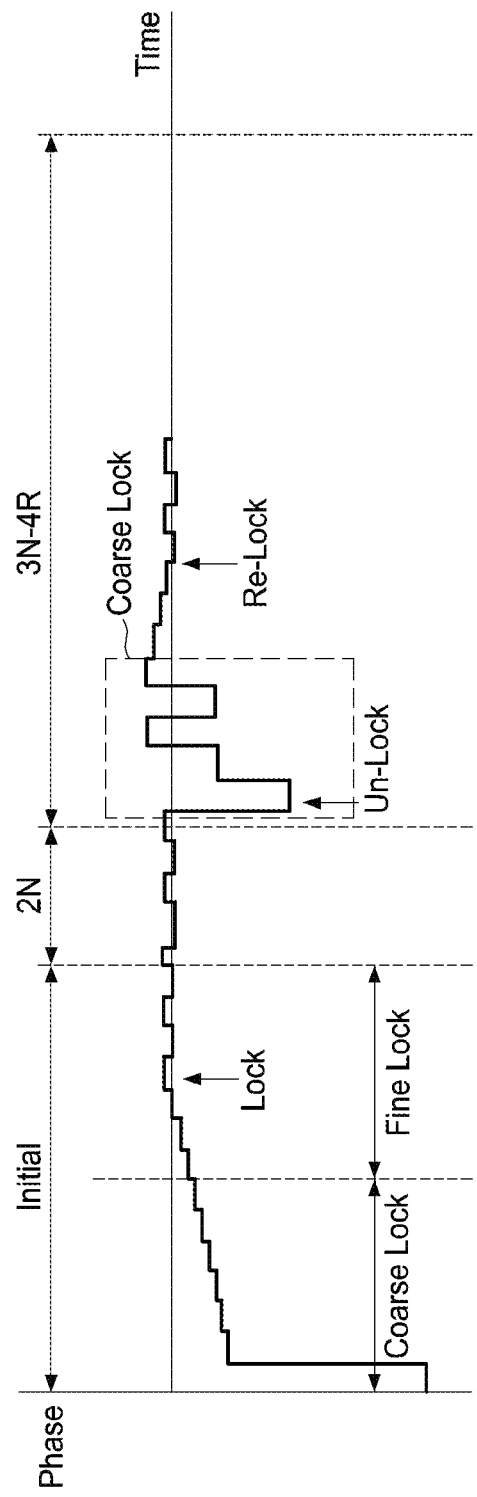
FIG. 4 is a view illustrating a locking operation of a DLL 110 according to example embodiments of the present inventive concepts.

FIG. 4 is a view illustrating a locking operation of a DLL 110 according to example embodiments of the present inventive concepts. Referring to FIG. 4, a DLL 110 may perform a coarse locking operation and a fine locking operation in an initialization period, and may then perform a coarse locking operation when unlocking occurs due to power noise. Therefore, a clock locking operation may be achieved faster, as compared to example embodiments in which unlocking is re-locked by a conventional fine locking operation.

Figure 5:
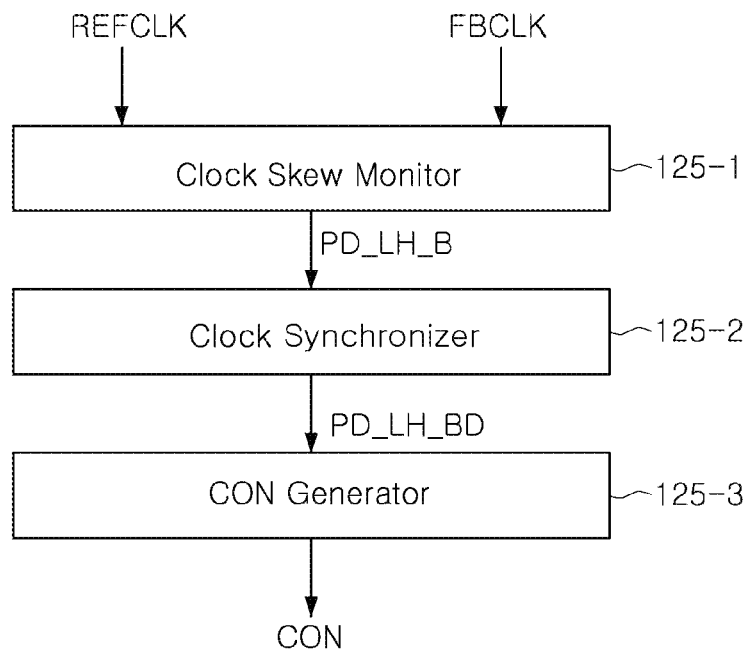
FIG. 5 is a view illustrating an internal configuration of a window detection circuit 125 according to example embodiments of the present inventive concepts.

FIG. 5 is a view illustrating an internal configuration of a window detection circuit 125 according to example embodiments of the present inventive concepts. Referring to FIG. 5, a window detection circuit 125 may include clock skew monitor 125-1, a clock synchronization circuit 125-2, and a monitor detection signal generator 125-3.

The clock skew monitor 125-1 may be implemented to monitor clock skew between a reference clock REFCLK and a feedback clock FBCLK, and to output a phase detection signal PD_LH_B corresponding thereto.

In example embodiments, the clock skew monitor 125-1 may be activated in response to an internal voltage stabilization signal PICC2D. In example embodiments, the clock skew monitor 125-1 may be forcibly deactivated by a test mode register set (TMRS).

The clock synchronization circuit 125-2 may be implemented to receive the phase detection signal PD_LH_B, and to output a phase detection signal PD_LH_BD synchronized with an internal clock.

The monitor detection signal generator 125-3 may be implemented to receive the synchronized phase detection signal PD_LH_BD, and to generate a monitor detection signal CON, corresponding to the clock skew between the reference clock REFCLK and the feedback clock FBCLK.

Figure 6:
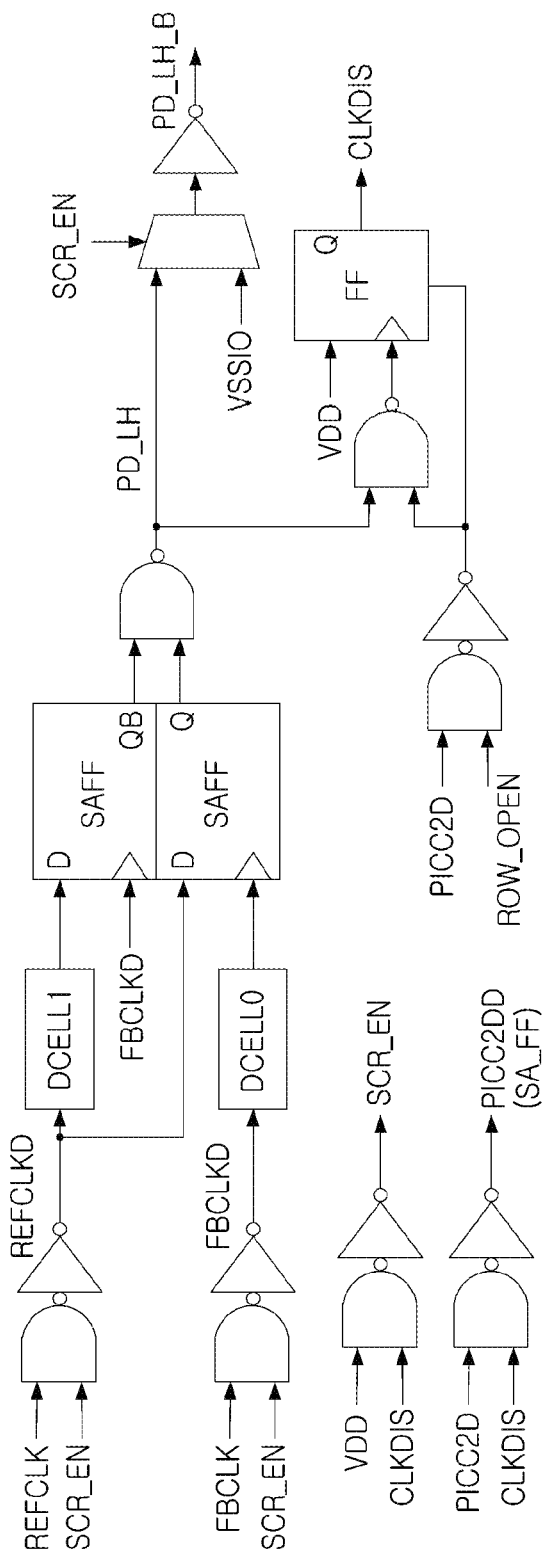
FIGS. 6 and 7 are views illustrating an operation of clock skew monitor 125-1 according to example embodiments of the present inventive concepts.
Figure 7:
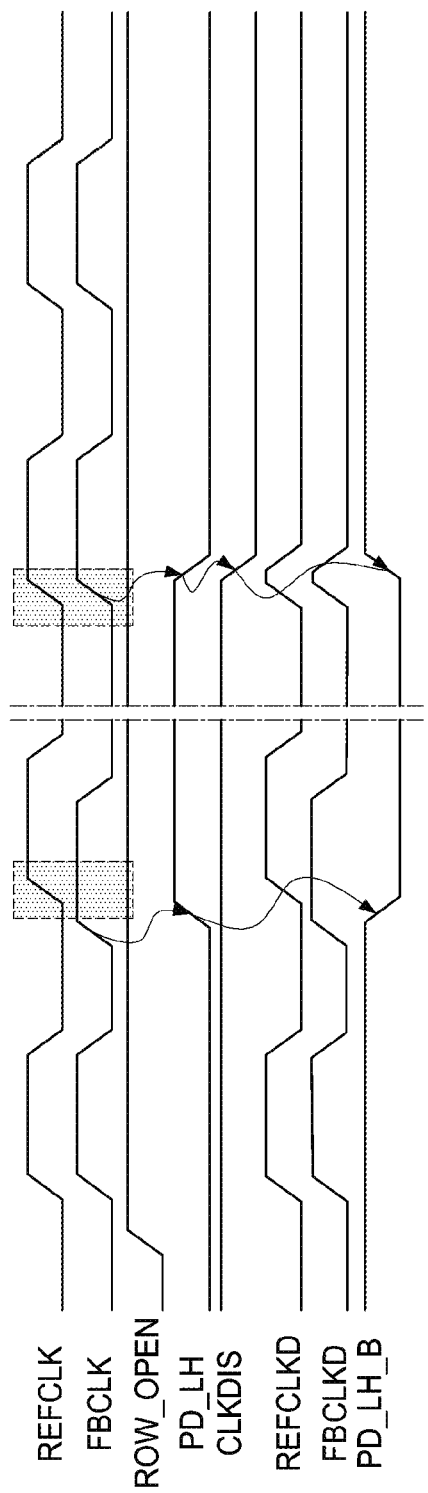

FIGS. 6 and 7 are views illustrating an operation of clock skew monitor 125-1 according to example embodiments of the present inventive concepts. Referring to FIGS. 6 and 7, a clock skew monitor 125-1 may monitor clock skew between a reference clock REFCLK and a feedback clock FBCLK, and may output a phase detection signal PD_LH_B corresponding thereto.

Referring to FIG. 6, the clock skew monitor 125-1 may receive a reference clock REFCLK, a feedback clock FBCLK, a dynamic skew monitor signal DYNSKEW_SCR_ON, an internal voltage stabilization signal PICC2D, and/or a row open signal ROW_OPEN. In some example embodiments, the dynamic skew monitor signal DYNSKEW_SCR_ON may be a signal that monitors dynamic skew. The row open signal ROW_OPEN may be forcibly made to be disable (e.g., L; low level state) by a TMRS.

In example embodiments, a clock deactivation signal CLKDIS may be generated by operating the internal voltage stabilization signal PICC2D, the row open signal ROW_OPEN, and a phase detection signal PD_LJ. The monitor activation signal SCR_EN may be a signal defining a period in which the first phase detector PD1 operates.

In example embodiments, a monitor activation signal SCR_EN may be generated by operating the dynamic skew monitor signal DYNSKEW_SCR_ON and the clock deactivation signal CLKDIS. In example embodiments, an internal voltage signal PICC2DD, provided to a flip-flop of a sense amplifier, may be generated according to an operation result of the internal voltage stabilization signal PICC2D and the clock deactivation signal CLKDIS. In example embodiments, a delay reference clock REFCLKD may be generated by operating the reference clock REFCLK and the monitor activation signal SCR_EN.

In example embodiments, a delay feedback clock FBCLKD may be generated by operating the reference clock REFCLK and the monitor activation signal SCR_EN. In example embodiments, a phase detection signal PD_LH may be generated by operating the delay reference clock REFCLKD and the delay feedback clock FBCLKD via delay cells DCELL1 and DCELL0 and a flip-flop SAFF, corresponding thereto. A multiplexer may select one of the phase detection signal PD_LH and a ground signal VSSIO, in response to the monitor activation signal SCR_EN.

The clock skew monitor 125-1 may invert an output signal of the multiplexer to output the phase detection signal PD_LH_B.

Figure 8:
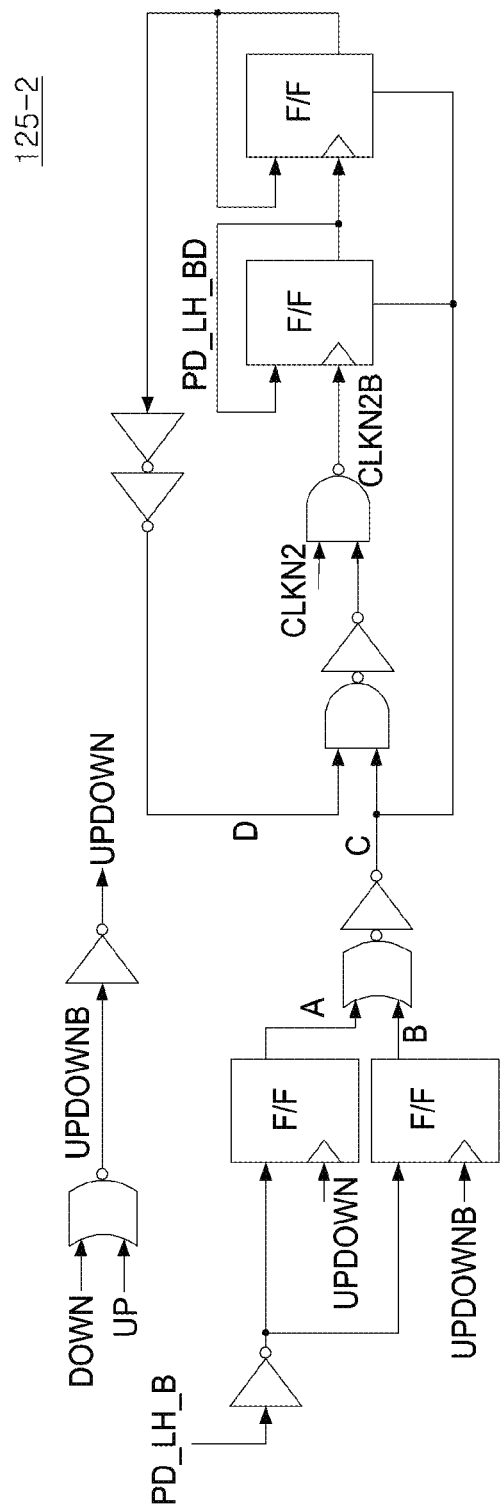
FIGS. 8 and 9 are views illustrating an operation of a clock synchronization circuit 125-2 according to example embodiments of the present inventive concepts.
Figure 9:
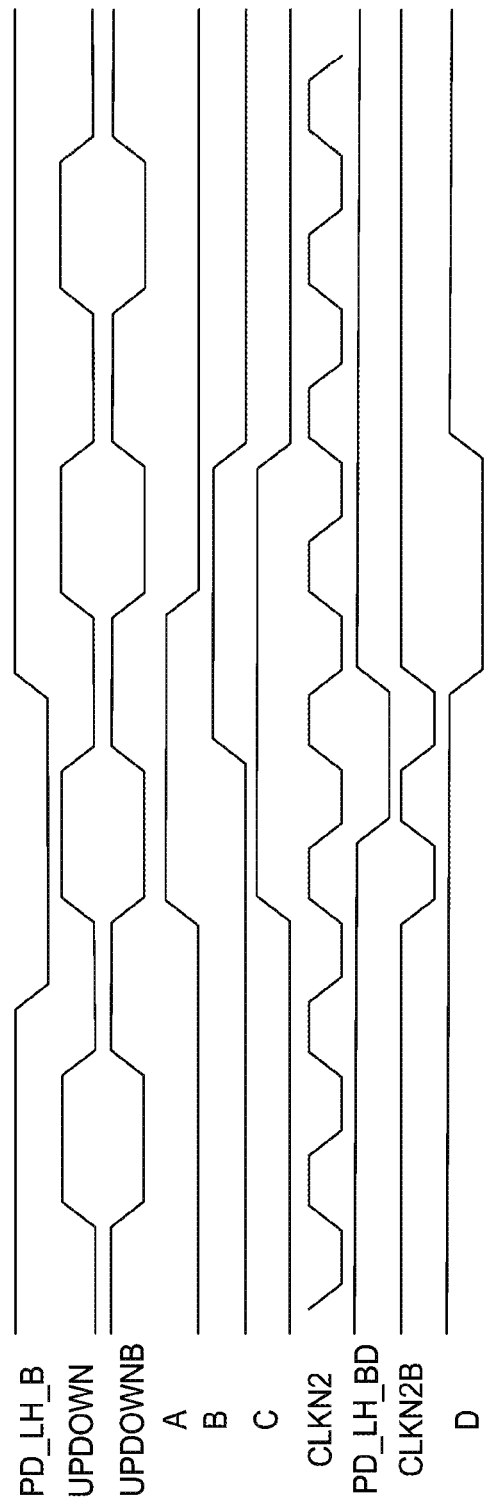

FIGS. 8 and 9 are views illustrating an operation of a clock synchronization circuit 125-2 according to example embodiments of the present inventive concepts. Referring to FIGS. 8 and 9, a clock synchronization circuit 125-2 may receive a phase detection signal PD_LH_B, and may output a phase detection signal PD_LH_BD synchronized with an internal clock.

Up-down signals UPDOWN and UPDOWNB may be generated by operating an up signal UP and a down signal DOWN.

A flip-flop F/F may output a signal A in response to an up-down signal UPDOWN of the phase detection signal PD_LH_B. In addition, the flip-flop F/F may output a signal B in response to a complementary up-down signal UPDOWNB of the phase detection signal PD_LH_B. A signal C may be generated by operating the signal A and the signal B.

The flip-flop F/F may input/output the phase detection signal PD_LH_BD in response to an operation result signal CLKN2B between an operation result signal of the signal C and a signal D, and an internal clock CLKN2. In some example embodiments, the signal D may be a signal obtained by delaying the phase detection signal PD_LH_BD of the flip-flop F/F.

Figure 10:
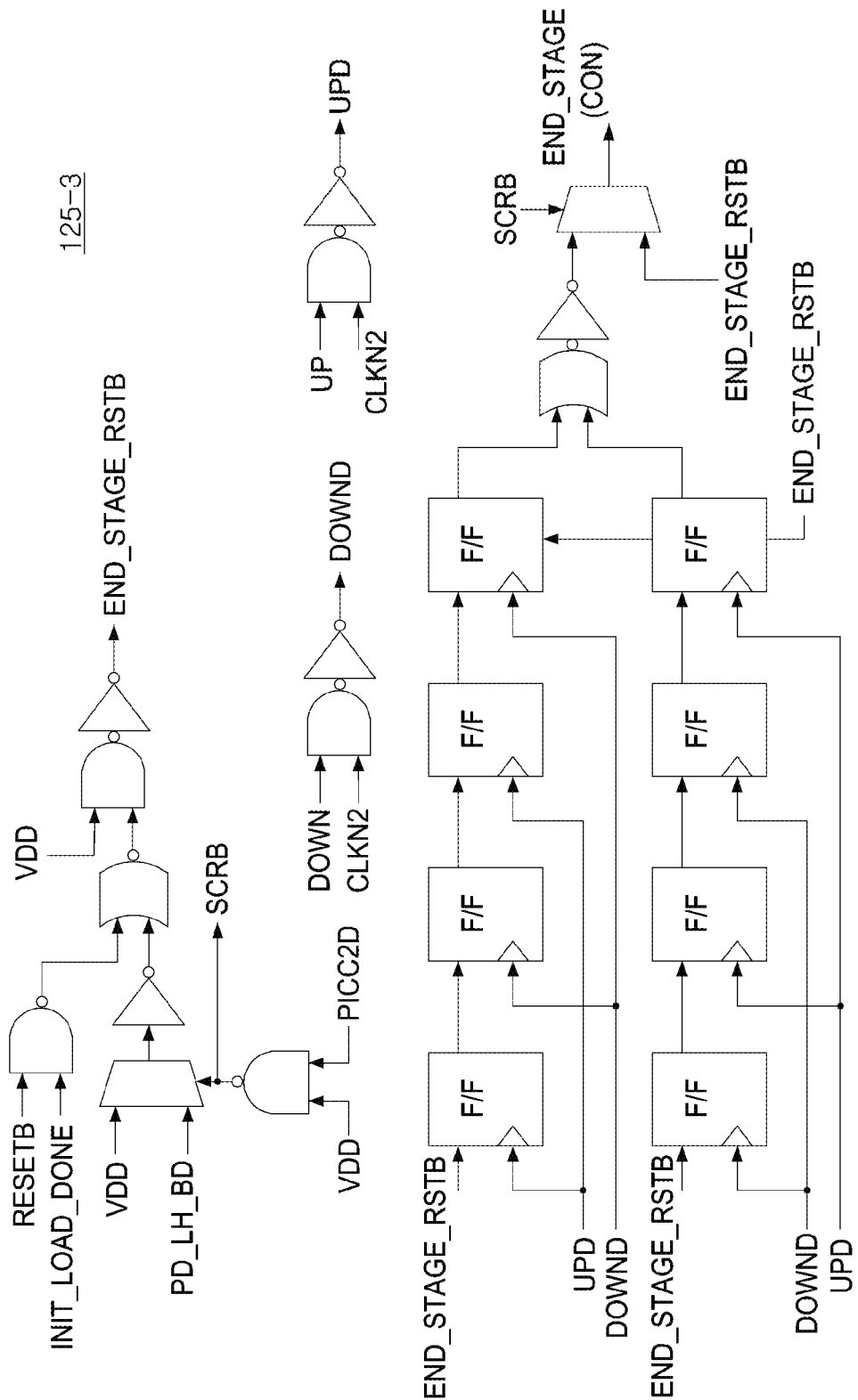
FIGS. 10 and 11 are views illustrating an operation of a monitor detection signal generator 125-3 according to example embodiments of the present inventive concepts.
Figure 11:
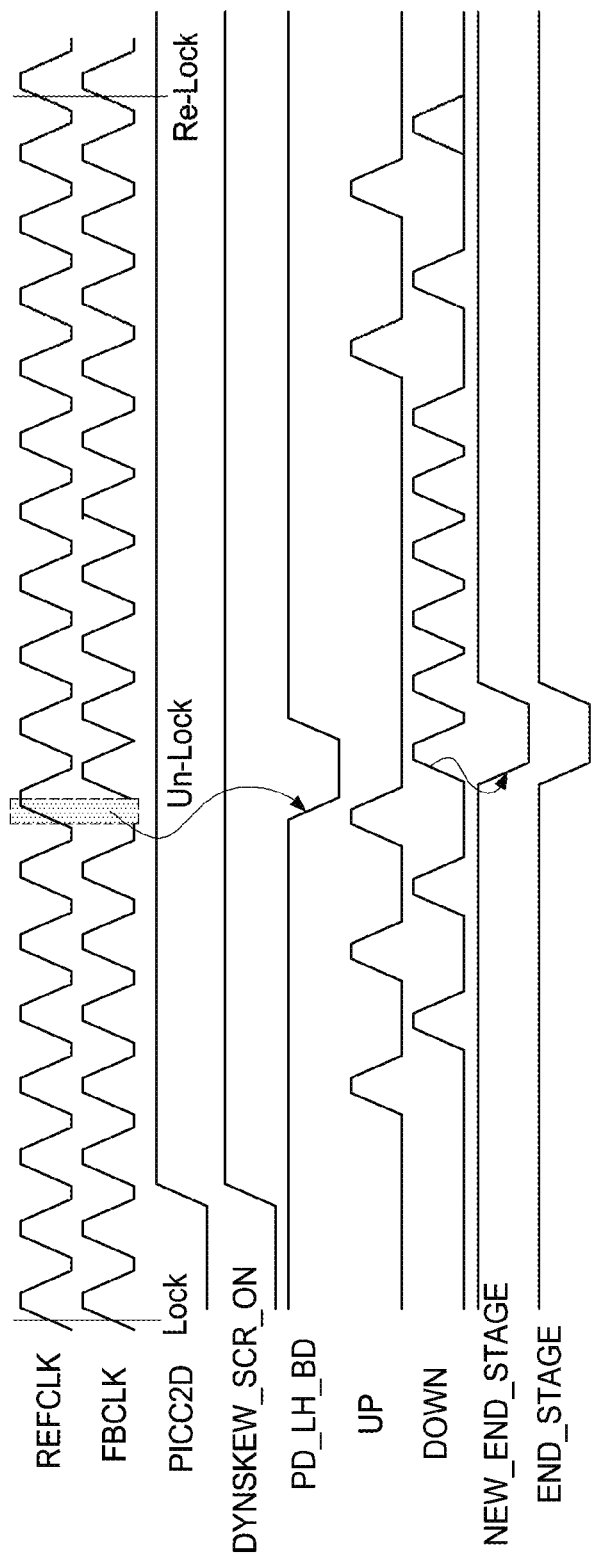

FIGS. 10 and 11 are views illustrating an operation of a monitor detection signal generator 125-3 according to example embodiments of the present inventive concepts.

Referring to FIGS. 10 and 11, a monitor detection signal generator 125-3 may receive a phase detection signal PD_LH_BD, and may generate a monitor detection signal CON.

An initialization load completion signal INIT_LOAD_DONE may be a signal to be loaded, such that a first phase detector PD1 sets a code value by a time-to-digital converter TDC, to the coarse delay line CDL. For example, the initialization load completion signal INIT_LOAD_DONE may be generated from a low level to a high level, after completing an operation of the first phase detector PD1.

A reset signal RESETB, the initialization load completion signal INIT_LOAD_DONE, the phase detection signal PD_LH_BD, and an internal voltage stabilization signal PICC2D may be operated to generate a completion stage reset signal END_STATE_RSTB.

A delayed down signal DOWMD may be generated by operating a down signal DOWN and an internal clock CLKN2. A delayed up signal UPD may be generated by operating an up signal UP and the internal clock CLKN2.

First flip-flops, connected in series, may output the completion stage reset signal END_STATE_RSTB in response to the delayed up signal UPD. Second flip-flops, connected in series, may output the completion stage reset signal END_STATE_RSTB in response to the delayed down signal DOWND.

A completion stage signal END_STAGE may be generated by operating output signals of the first flip-flops and output signals of the second flip-flops. In some example embodiments, the completion stage signal END_STAGE may be a signal indicating that a second phase detector PD2 operates.

A phase detection signal PD_LH_BD may be generated in response to clock skew between a reference clock REFCLK and a feedback clock FBCLK. As illustrated in FIG. 11, a new completion stage signal NEW_END_STAGE, corresponding to the phase detection signal PD_LH_BD, may be generated in response to a low level state of the up signal UP and a rising edge of the down signal DOWN. The new completion stage signal NEW_END_STAGE, newly generated, may be output as a monitor detection signal CON of a monitor detection circuit 125.

Figure 12:
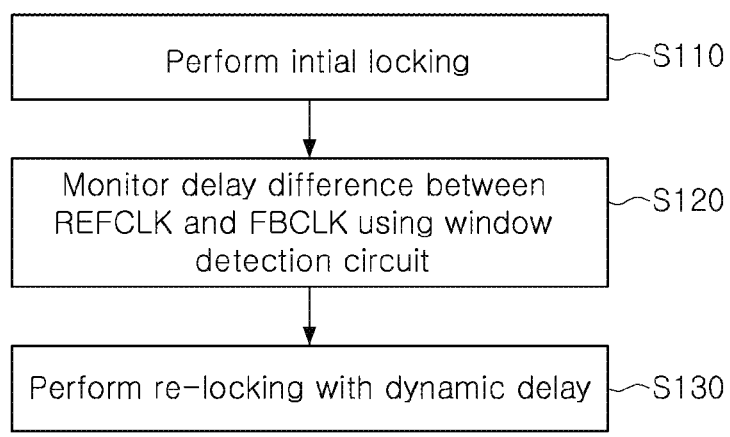
FIG. 12 is a flowchart illustrating a method of operating a memory device 100 according to example embodiments of the present inventive concepts.

FIG. 12 is a flowchart illustrating a method of operating a memory device 100 according to example embodiments of the present inventive concepts. Referring to FIGS. 1 to 12, the memory device 100 may operate as follows.

When the memory device 100 is powered-up, the memory device 100 may perform an initial locking operation. In some example embodiments, the initial locking operation may include a coarse locking operation and a fine locking operation. When an internal voltage is stabilized, a fine locking operation may be basically performed (S110).

The window detection circuit 125 of the memory device 100 may monitor delay skew between an input clock REFCLK and an output clock FBCLK of a DLL 110 (S120). When the delay skew exceeds a predetermined or alternatively, desired value, a monitor detection signal CON may be generated.

The DLL 110 may perform a coarse locking operation in response to the monitor detection signal CON, to perform a re-locking operation to convert an unlocked state into a locked state (S130).

A DLL according to example embodiments of the present inventive concepts may be applied to a memory device.

Figure 13:
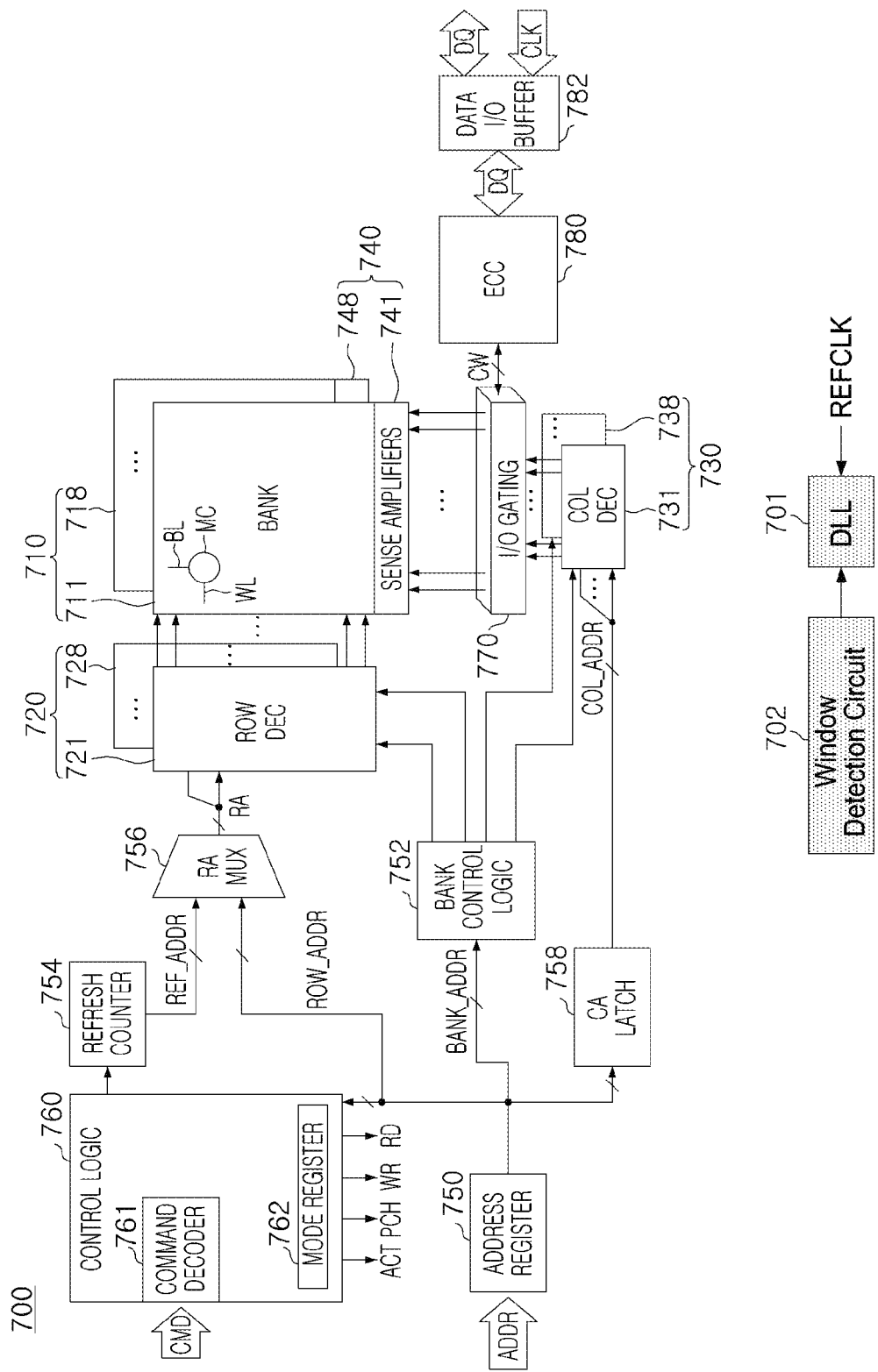
FIG. 13 is a view illustrating a memory device 700 according to example embodiments of the present inventive concepts.

FIG. 13 is a view illustrating a memory device 700 according to example embodiments of the present inventive concepts. Referring to FIG. 13, a memory device 700 may include a DLL 701, a window detection circuit 702, a memory cell array 710, a row decoder 720, a column decoder 730, a sense amplifier circuit 740, an address register 750, a bank control logic 752, a refresh counter 754, a row address multiplexer 756, a column address latch 758, a control logic 760, a repair control circuit 766, a timing control circuit 764, an input/output gating circuit 770, an error correction circuit 780, and/or a data input/output buffer 782.

The DLL 701 may quickly perform a coarse locking operation in response to the monitor detection signal CON, as described in FIGS. 1 to 12. In addition, the window detection circuit 702 may monitor the delay skew between the reference clock REFCLK and the feedback clock FBCLK, and may output the monitor detection signal CON according to the monitoring result, as described in FIGS. 1 to 12.

The memory cell array 710 may include first to eighth banks 711 to 718. It can be understood that the number of banks of the memory cell array 710 is not limited thereto. The row decoder 720 may include first to eighth bank row decoders 721 to 728, respectively connected to the first to eighth banks 711 to 718. The column decoder 730 may include first to eighth bank column decoders 731 to 738, respectively connected to the first to eighth banks 711 to 718. The sense amplifier circuit 740 may include first to eighth bank sense amplifiers 741 to 748, respectively connected to the first to eighth banks 711 to 718.

The first to eighth banks 711 to 718, the first to eighth bank row decoders 721 to 728, the first to eighth bank column decoders 731 to 738, and the first to eighth bank sense amplifiers 741 to 748 may configure first to eighth banks, respectively. Each of the first to eighth banks 711 to 718 may include a plurality of memory cells MC formed at points in which word lines WL and bit lines BL intersect.

The address register 750 may receive and store an address ADDR having a bank address BANK_ADDR, a row address ROW_ADDR, and a column address COL_ADDR, from an external memory controller. The address register 750 may provide a received bank address BANK_ADDR to the bank control logic 752, may provide a received row address ROW_ADDR to the row address multiplexer 756, and may provide a received column address COL_ADDR to the column address latch 758.

The bank control logic 752 may generate bank control signals in response to the bank address BANK_ADDR. In response to the bank control signals, a bank row decoder corresponding to the bank address BANK_ADDR, among the first to eighth bank row decoders 721 to 728, may be activated. In response to the bank control signals, a bank column decoder corresponding to the bank address BANK_ADDR, among the first to eighth bank column decoders 731 to 738, may be activated.

The row address multiplexer 756 may receive the row address ROW_ADDR from the address register 750, and may receive a refresh row address REF_ADDR from the refresh counter 754. The row address multiplexer 756 may selectively output the row address ROW_ADDR or the refresh row address REF_ADDR as a row address RA. The row address RA, output from the row address multiplexer 756, may be applied to the first to eighth bank row decoders 721 to 728, respectively.

Among the first to eighth bank row decoders 721 to 728, a bank row decoder activated by the bank control logic 752 may decode the row address RA, output from the row address multiplexer 756, to activate a word line corresponding to the row address. For example, the activated bank row decoder may apply a word line driving voltage to the word line corresponding to the row address. In addition, the activated bank row decoder may activate the word line corresponding to the row address, and may simultaneously activate a redundancy word line corresponding to a redundancy row address output from the repair control circuit 766.

The column address latch 758 may receive the column address COL_ADDR from the address register 750, and may temporarily store the received column address COL_ADDR. Further, the column address latch 758 may gradually increase the received column address COL_ADDR in a burst mode. The column address latch 758 may apply the temporarily stored or gradually increased column address COL_ADDR to the first to eighth bank column decoders 731 to 738, respectively.

Among the first to eighth bank column decoders 731 to 738, a bank column decoder activated by the bank control logic 752 may activate sense amplifiers, corresponding to the bank address BANK_ADDR and the column address COL_ADDR, by the input/output gating circuit 770. Also, the activated bank column decoder may perform a column repair operation in response to a column repair signal CRP output from the repair control circuit 766.

The control logic 760 may be implemented to control an operation of the memory device 700. For example, the control logic 760 may generate control signals such that the semiconductor memory device 700 performs a write operation or a read operation. The control logic 760 may include a command decoder 761 decoding a command CMD received from a memory controller, and a mode register set 762 setting an operation mode of the memory device 700.

For example, the command decoder 761 may decode a write enable signal /WE, a row address strobe signal /RAS, a column address strobe signal /CAS, a chip select signal /CS, and the like, to generate operation control signals ACT, PCH, WE, and RD, corresponding to the command CMD. The control logic 760 may provide the operation control signals ACT, PCH, WE, and RD to the timing control circuit 764. The operation control signals ACT, PCH, WR, and RD may include an active signal ACT, a precharge signal PCH, a write signal WR, and a read signal RD, respectively.

Input/output gating circuits in the input/output gating circuit 770 may include an input data mask logic, read data latches storing data output from the first to eighth banks 711 to 718, and write drivers writing data to the first to eighth banks 711 to 718, together with circuits gating input/output data, respectively.

A codeword CW to be read from one bank of the first to eighth banks 711 to 718 may be sensed by a sense amplifier corresponding to the one bank, and may be stored in the read data latches. The codeword CW stored in the read data latches may be performed for ECC decoding by the error correction circuit 780, and may be provided to a memory controller by the data input/output buffer 782. Data DQ to be written to one bank of the first to eighth banks 711 to 718 may be performed for ECC decoding by the error correction circuit 780, and may be written to the one bank by the write drivers.

The data input/output buffer 782 may provide data DQ to the error correction circuit 780, based on a clock signal CLK provided from a memory controller, in a write operation, and may provide the data DQ from the error correction circuit 780 to the memory controller in a read operation.

The error correction circuit (ECC) 780 may generate parity bits, based on data bits of the data DQ provided from the data input/output buffer 782, in a write operation, and may provide a code word including the data DQ and the parity bits the input/output gating circuit 770. The input/output gating circuit 770 may write the code word to a bank. In addition, the error correction circuit 780 may receive the codeword CW read from the one bank from the input/output gating circuit 770 in a read operation. The error correction circuit 780 may use the parity bits included in the read codeword CW to perform ECC decoding on the data DQ, and may correct at least one error bit included in the data DQ, to provide the correction error bit to the data input/output buffer 782.

A memory device 700 according to example embodiments of the present inventive concepts may quickly control delay skew due to power noise in an internal voltage stabilization state.

Figure 14:
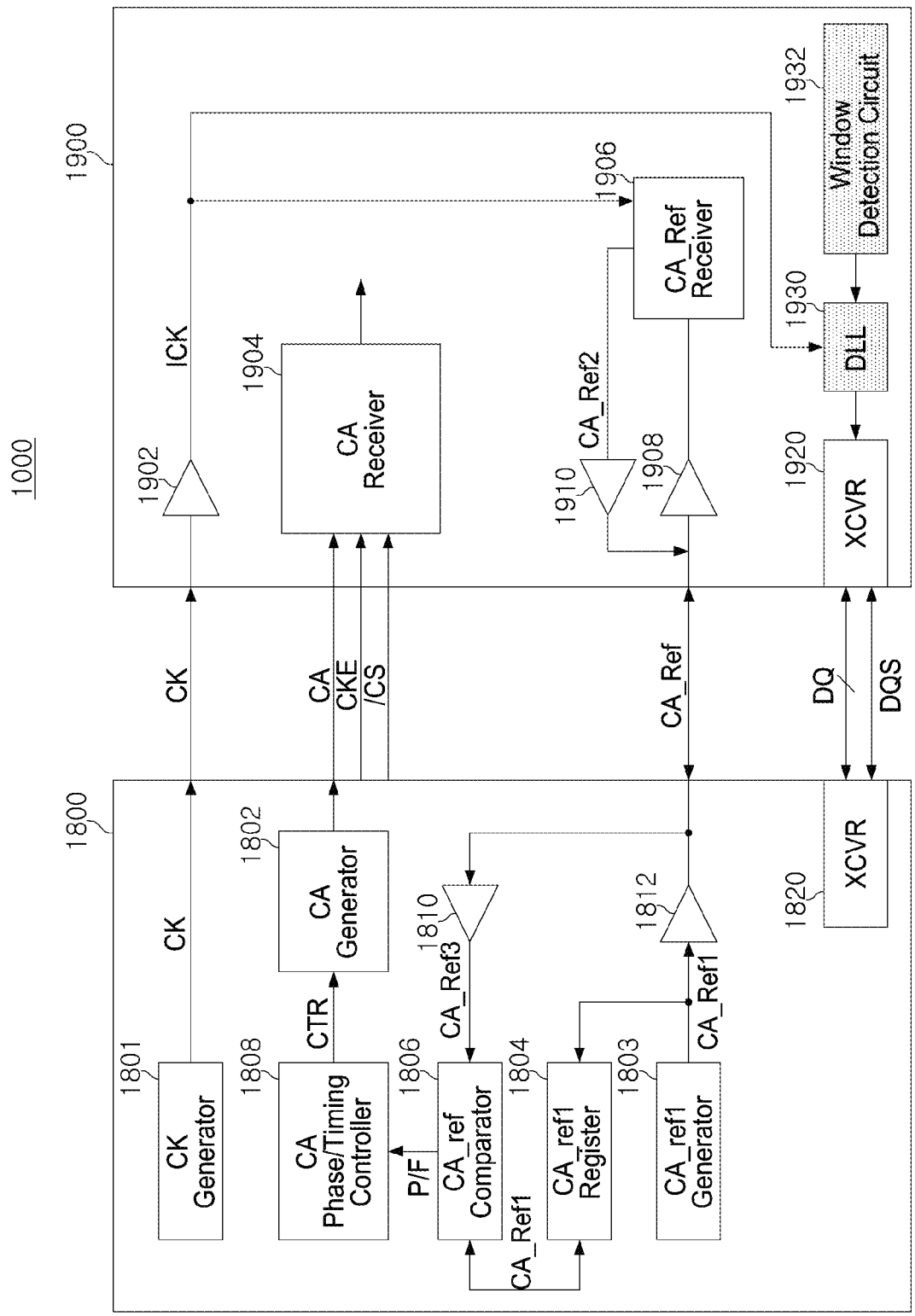
FIG. 14 is a view illustrating a memory system performing at least one command/address calibration according to example embodiments of the present inventive concepts.

FIG. 14 is a view illustrating a memory system performing at least one command/address calibration according to example embodiments of the present inventive concepts.

Referring to FIG. 14, a memory system 1000 may include a controller 1800 and a memory device 1900. The controller 1800 may include a clock generator 1801, a command/address (CA) generator 1802, a command/address reference generator 1803, a register 1804, a comparator 1806, a phase/timing controller 1808, and/or data input/output units 1810 and 1812. The controller 1800 may provide a clock signal CK generated by the clock generator 1801 to the memory device 1900 through a clock signal line.

In example embodiments, the memory system 1000 may include a separate command/address reference signal CA_Ref line in an interface. The command/address reference signal CA_Ref line may transmit/receive a command/address reference signal CA_Ref, which may be a reference value of the command/address, in a calibration mode.

The calibration result value using the reference value of the command/address may be provided to the phase/timing controller 1808, to adjust a phase/timing of a command/address signal CA. Since there may be the separate command/address reference signal CA_Ref line, there may be an advantage that a calibration operation that may adjust the phase/timing of the command/address signal CA may be performed while transmitting the command/address signal CA.

The CA generator 1802 may generate a command/address signal CA of which phase or timing is adjusted in response to a control signal CTR of the phase/timing controller 1808, and may transmit the command/address signal CA to the memory device 1900 through a CA bus.

The command/address reference generator 1803 may be configured in the same manner as the command/address generator 1802, and may generate a first command/address reference signal CA_Ref1 identical to the command/address signal CA generated from the command/address generator 1802.

The first command/address reference signal CA_Ref1 may be provided to the register 1804. Further, the first command/address reference signal CA_Ref1 may be transmitted to a CA reference bus 12 by a data output unit 1812, and may be provided to the memory device 1900 through the CA reference bus 16.

The register 1804 may store the first command/address reference signal CA_Ref1. The comparator 1806 may compare the first command/address reference signal CA_Ref1 stored in the register 1804 and a third command/address reference signal CA_Ref3 output from a data input unit 1810. The comparator 1806 may compare data of the first command/address reference signal CA_Ref1 and data of the third command/address reference signal CA_Ref3, to generate a pass or fail signal P/F.

The phase/timing controller 1808 may generate a control signal CTR indicating a phase shift of the command/address signal CA according to the pass or fail signal P/F of the comparator 1806. The control signal CTR may adjust phase or timing of the command/address signal CA to generate a phase-adjusted command/address signal CA.

The data input unit 1810 may receive a second command/address reference signal CA_Ref2 transmitted from the memory device 1900 through the CA reference bus, and may transmit the received second command/address reference signal CA_Ref2 to the comparator 1806 as a third command/address reference signal CA_Ref3.

The data output unit 1812 may receive the first command/address reference signal CA_Ref1 generated by the command/address reference generator 1803, and may transmit the received first command/address reference signal CA_Ref1 to the CA reference bus 12.

The memory device 1900 may include a clock buffer 1902, a command/address (CA) receiver 1904, a command/address reference receiver 1906, and/or data input/output units 1908 and 1910. The clock buffer 1902 may receive the clock signal CK transmitted through the clock signal line to generate an internal clock signal ICK. The CA receiver 1904 may receive a chip select signal /CS, a clock enable signal CKE, and a command/address signal CA transmitted through a CA bus, in response to the internal clock signal ICK.

The clock enable signal CKE may be used as a pseudo command acting as a read command of the command/address signal CA transmitted through the CA bus. The CA receiver 1904 may receive the command/address signal CA, when the clock enable signal CKE is activated.

A data input unit 1908 may receive the first command/address reference signal CA_Ref1 transmitted from the controller 1800 through the CA reference bus, and transmit it to the command/address reference receiver 1906. The command/address reference receiver 1906 may be configured in the same manner as the CA receiver 1904. The command/address reference receiver 1906 may receive a chip select signal /CS, a clock enable signal CKE, and a first command/address reference signal CA_Ref1 transmitted through the CA reference bus, in response to the internal clock signal ICK, to generate a second command/address reference signal CA_Ref2.

The second command/address reference signal CA_Ref2 may be the same as a signal that receives and outputs a chip select signal /CS, a clock enable signal CKE, and the command/address signal CA transmitted through the CA bus, in response to an internal clock signal ICK, in the CA receiver 1904. The second command/address reference signal CA_Ref2 may be transmitted to the CA reference bus through a data output unit 1910.

CA calibration performed in the memory system 1000 may be as follows. The CA generator 1802 of the controller 1800 may adjust phase or timing of a command/address signal CA, in response to a control signal CTR of the phase/timing controller 1808, to transmit the command/address signal CA to the CA bus. The command/address reference generator 1803 may generate the same first command/address reference signal CA_Ref1 as the command/address signal CA, and transmit the generated first command/address reference signal CA_Ref1 to the CA reference bus.

The CA reference receiver 1906 of the memory device 1900 may receive a first command/address reference signal CA_Ref1 according to an internal clock signal ICK and a clock enable signal CKE, and may generate a second command/address reference signal CA_Ref2. The second command/address reference signal CA_Ref2 of the memory device 1900 may be transmitted to a CA reference bus.

The controller 1800 may transmit the second command/address reference signal CA_Ref2 transmitted through the CA reference bus as a second command/address reference signal CA_Ref2, to the comparator 1806. The comparator 1806 may compare data of the first command/address reference signal CA_Ref1 and data of the third command/address reference signal CA_Ref3, to generate a pass or fail signal P/F. The phase/timing controller 1808 may generate a control signal CTR indicating a phase shift of the command/address signal CA according to the pass or fail signal P/F of the comparator 1806. The CA generator 1802 may generate a command/address signal CA of which phase is adjusted according to the control signal CTR.

By repetition of the CA calibration operation, the phase/timing controller 1808 of the controller 1800 may determine central portions of passed (P) positions as a central portion of a command/address signal CA window, and a command/address signal CA may be generated and provided to the memory device 1900 such that the central portion of the command/address signal CA window comes to an edge of a clock signal CK. Therefore, the memory device 1900 may receive a command/address signal CA in which a central portion of an effective window is located at rising/falling edges of a pair of clock signals CK and CKB at the rising/falling edge of the clock signal CK.

As illustrated in FIG. 14, the controller 1800 and the memory device 1900 of the memory system 1000 may include transceivers 1820 and 1920, respectively corresponding thereto. In particular, the memory device 1900 may include a DLL 1930, generating a DQS signal, and a window detection circuit 1932. As described with reference to FIGS. 1 to 12, the memory device 1900 may perform a DLL operation for rapidly converting an unlocked state due to power noise into a re-locked state.

A memory device according to example embodiments of the present inventive concepts may be applied to an automotive system.

Figure 15:
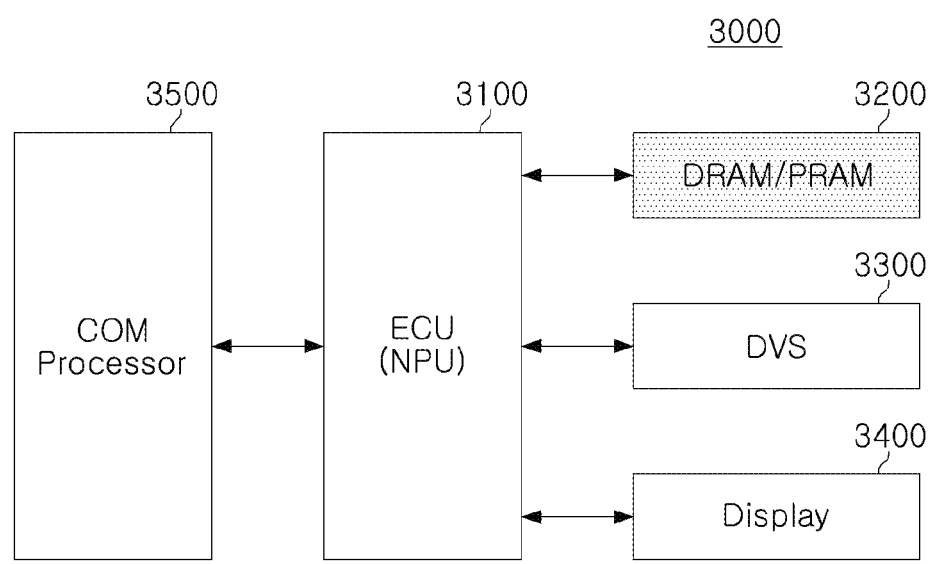
FIG. 15 is a view illustrating an electronic system 3000 for a vehicle according to example embodiments of the present inventive concepts.

FIG. 15 is a view illustrating an electronic system 3000 for a vehicle according to example embodiments of the present inventive concepts. Referring to FIG. 15, an electronic system 3000 may include at least one electronic control unit (ECU) 3100, a memory device 3200, a dynamic range sensor (DVS) 3300, a display device 3400, and/or a communication processor 3500.

The electronic control unit (ECU) 3100 may be implemented to control an overall operation. The ECU 3100 may process image data received from the DVS 3300. The ECU 3100 may include a neural processing unit (NPU). The NPU may quickly derive an optimal image for driving by comparing the image received from the DVS 3300 with the learning model.

The memory device 3200 may be implemented to store a learning model related to the operation of the NPU. The memory device 3200 may include a volatile or non-volatile memory device. For example, the memory device 3200 may be a DRAM or a PRAM. In particular, the memory device 3200 may be implemented to perform the DLL operation, as described with reference to FIGS. 1 to 13.

The DVS 3300 may be implemented to sense an environment outside a vehicle. The DVS 3300 may output an event signal in response to a change in relative light intensity. The DVS 3300 may include a pixel array including a plurality of DVS pixels and a plurality of address event handlers.

The display device 3400 may be implemented to display an image processed by the ECU 3100 or an image transmitted by the communication processor 3500.

The communication processor 3500 may be implemented to transmit the processed image to an external device, for example, an external vehicle, or to receive an image from the external vehicle. For example, the communication processor 3500 may be implemented to perform wired or wireless communication with the external device.

A data communication method according to example embodiments of the present inventive concepts may be applied to a data center.

Figure 16:
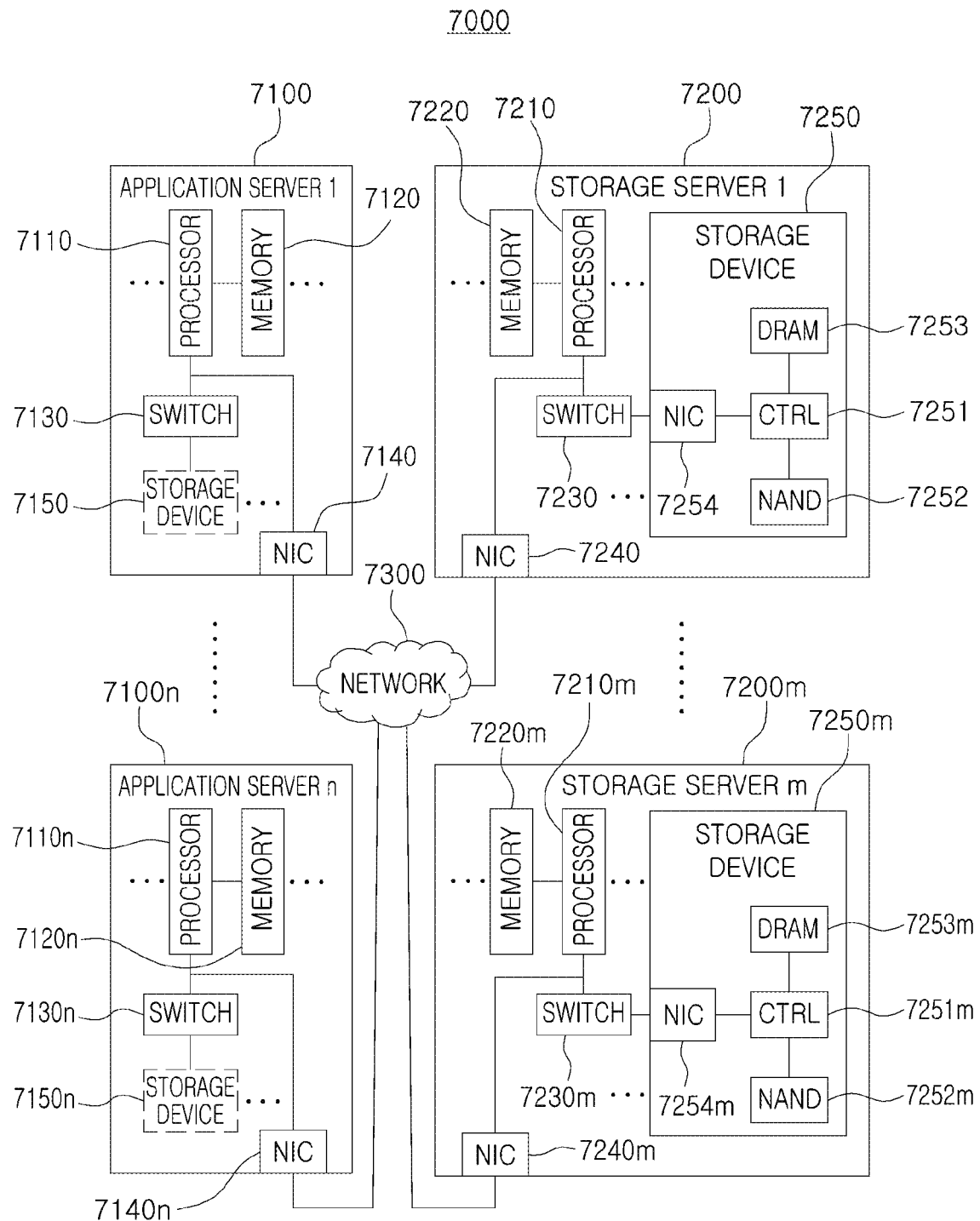
FIG. 16 is a view illustrating a data center to which a memory device according to example embodiments of the present inventive concepts is applied.

FIG. 16 is a view illustrating a data center to which a memory device according to example embodiments of the present inventive concepts is applied. Referring to FIG. 16, a data center 7000 may be a facility that collects various types of data and provides services, and may be referred to as a data storage center. The data center 7000 may be a system for operating a search engine and a database, and may be a computing system used by a company such as a bank or the like, or a government institution. The data center 7000 may include application servers 7100 to 7100*n* and storage servers 7200 to 7200*m*. The number of application servers 7100 to 7100*n* and the number of storage servers 7200 to 7200*m* may be variously selected according to example embodiments, and the number of application servers 7100 to 7100*n* may be different from the number of storage servers 7200 to 7200*m*.

An application server 7100 or a storage server 7200 may include at least one of processors 7110 and 7210 or memories 7120 and 7220. When describing the storage server 7200 as an example, a processor 7210 may control an overall operation of the storage server 7200, and may access a memory 7220 to execute a command or data loaded in the memory 7220. The memory 7220 may be a double data rate synchronous DRAM (DDR SDRAM), a high bandwidth memory (HBM), a hybrid memory cube (HMC), a dual in-line memory module (DIMM), an Optane DIMM, or a non-volatile DIMM (NVMDIMM). According to example embodiments, the number of processors 7210 and the number of memories 7220 included in the storage server 7200 may be variously selected.

In example embodiments, the processor 7210 and the memory 7220 may provide a processor-memory pair. In example embodiments, the number of the processors 7210 may be different from the number of the memories 7220. The processor 7210 may include a single core processor or a multiple core processor. The description of the storage server 7200 may be similarly applied to the application server 7100. According to example embodiments, the application server 7100 may not include a storage device 7150. The storage server 7200 may include at least one storage device 7250. The storage device 7250 may be implemented to perform clock locking to control dynamic delay in a power noise environment as described in FIGS. 1 to 15.

The application servers 7100 to 7100*n* and the storage servers 7200 to 7200*m* may communicate with each other via a network 7300. The network 7300 may be implemented using a fiber channel (FC), Ethernet, or the like. In some example embodiments, the FC may be a medium used for relatively high-speed data transmission, and may use an optical switch that provides high performance/high availability. Depending on an access method of the network 7300, the storage servers 7200 to 7200*m* may be provided as file storage, block storage, or object storage.

In example embodiments, the network 7300 may be a storage-only network such as a storage area network (SAN). For example, the SAN may be an FC-SAN using an FC network and implemented according to an FC protocol (FCP). For another example, the SAN may be an IP-SAN using a TCP/IP network and implemented according to an SCSI over TCP/IP or Internet SCSI (iSCSI) protocol. In other example embodiments, the network 7300 may be a general network such as a TCP/IP network. For example, the network 7300 may be implemented according to protocols such as an FC over Ethernet (FCoE) protocol, a network attached storage (NAS) protocol, an NVMe over Fabrics (NVMe-oF) protocol, or the like.

In the following, description will be made focusing on the application server 7100 and the storage server 7200. The description of the application server 7100 may be applied to other application servers 7100*n*, and the description of the storage server 7200 may be applied to other storage servers 7200*m*.

The application server 7100 may store data, requested to be stored by a user or a client, in one of the storage servers 7200 to 7200*m* via the network 7300. In addition, the application server 7100 may acquire data, requested to be read by a user or a client, from one of the storage servers 7200 to 7200*m* via the network 7300. For example, the application server 7100 may be implemented as a web server, a database management system (DBMS), or the like.

The application server 7100 may access a memory 7120*n* or a storage device 7150*n* included in the other application server 7100*n* via the network 7300, or may access memories 7220 to 7220*m* or storage devices 7250 to 7250*m* included in the storage servers 7200 to 7200*m* via the network 7300. Therefore, the application server 7100 may perform various operations for data stored in the application servers 7100 to 7100*n* or the storage servers 7200 to 7200*m*. For example, the application server 7100 may execute a command for moving or copying data between the application servers 7100 to 7100*n* or the storage servers 7200 to 7200*m*. In some example embodiments, the data may move from the storage devices 7250 to 7250*m* of the storage servers 7200 to 7200*m* to the memories 7120 to 7120*n* of the application servers 7100 to 7100*n* via the memories 7220 to 7220*m* of the storage servers 7200 to 7200*m*, or may directly move from the storage devices 7250 to 7250*m* of the storage servers 7200 to 7200*m* to the memories 7120 to 7120*n* of the application servers 7100 to 7100*n*. Data moving via the network 7300 may be encrypted data for security or privacy.

Referring to the storage server 7200 as an example, an interface 7254 may provide a physical connection between the processor 7210 and a controller 7251 and a physical connection between an NIC 7240 and the controller 7251. For example, the interface 7254 may be implemented by a direct attached storage (DAS) method in which the storage device 7250 is directly connected by a dedicated cable. In addition, for example, the interface 7254 may be implemented by various interface methods such as an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI express (PCIe) interface, an NVM express (NVMe) interface, IEEE 1394, an universal serial bus (USB) interface, a secure digital (SD) card interface, a multi-media card (MMC) interface, an embedded multi-media card (eMMC) interface, a universal flash storage (UFS) interface, an embedded universal flash storage (eUFS) interface, a compact flash (CF) card interface, or the like.

The storage server 7200 may further include a switch 7230 and an NIC 7240. The switch 7230 may selectively connect the processor 7210 and the storage device 7250 or may selectively connect the NIC 7240 and the storage device 7250 according to control of the processor 7210.

In example embodiments, the NIC 7240 may include a network interface card, a network adapter, or the like. The NIC 7240 may be connected to the network 7300 via a wired interface, a wireless interface, a Bluetooth interface, an optical interface, or the like. The NIC 7240 may include an internal memory, a DSP, a host bus interface, or the like, and may be connected to the processor 7210, the switch 7230, or the like via a host bus interface. The host bus interface may be implemented as one of the examples of the interface 7254 described above. In example embodiments, the NIC 7240 may be integrated with at least one of the processor 7210, the switch 7230, and the storage device 7250.

In the storage servers 7200 to 7200*m* or the application servers 7100 to 7100*n*, the processor may transmit a command to the storage devices 7150 to 7150*n* and 7250 to 7250*m* or the memories 7120 to 7120*n* and 7220 to 7220*m*, to program or read data. In some example embodiments, the data may be data that has been error-corrected by an error correction code (ECC) engine. The data may be data that has been processed by data bus inversion (DBI) or data masking (DM), and may include cyclic redundancy code (CRC) information. The data may be encrypted data for security or privacy.

The storage devices 7150 to 7150*n* and 7250 to 7250*m* may transmit a control signal and a command/address signal to NAND flash memory devices 7252 to 7252*m* in response to a read command received from a processor. Therefore, when data are read from the NAND flash memory devices 7252 to 7252*m*, a read enable (RE) signal may be input as a data output control signal, and may serve to output data to a DQ bus. The RE signal may be used to generate a data strobe (DQS). The command and address signals may be latched in a page buffer according to a rising edge or a falling edge of a write enable (WE) signal.

The controller 7251 may thoroughly control an operation of the storage device 7250. In example embodiments, the controller 7251 may include a static random access memory (SRAM). The controller 7251 may write data to the NAND flash memory device 7252 in response to a write command, or may read data from the NAND flash memory device 7252 in response to a read command. For example, the write command or the read command may be provided from the processor 7210 in the storage server 7200, the processor 7210*m* in another storage server 7200*m*, or the processors 7110 and 7110*n* in the application servers 7100 and 7100*n*. A DRAM 7253 may temporarily store (buffer) data to be written to the NAND flash memory device 7252, or may temporarily store (buffer) data read from the NAND flash memory device 7252. Also, the DRAM 7253 may store metadata. In some example embodiments, the metadata may be user data, or may be data generated by the controller 7251 to manage the NAND flash memory device 7252. The storage device 7250 may include a secure element (SE) for security or privacy.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The contents of the present inventive concepts described above are only specific examples for carrying out the present inventive concepts. The present inventive concepts will include not only specific and practically usable means itself, but also technical ideas that may be abstract and conceptual ideas capable of being utilized as future technologies.

A memory device and a clock locking method thereof according to example embodiments of the present inventive concepts may monitor a change in clock skew due to power noise and may dynamically control a delay line according to a monitoring result, to perform a clock locking operation more quickly.

While example embodiments have been illustrated and described above, it will be apparent to those skilled in the art that modifications and variations could be made without departing from the scope of the present inventive concepts as defined by the appended claims.

What is claimed is:

1. A memory device comprising:
    a first delay line configured to delay a reference clock according to a first code value to output a first delayed clock;
    a second delay line configured to delay the first delayed clock according to a second code value to output a second delayed clock;
    a first delay line controller configured to generate the first code value according to a first phase difference value or to generate the first code value according to a second phase difference value;
    a second delay line controller configured to generate the second code value according to the second phase difference value;
    a de-multiplexer configured to output the second phase difference value to one of the first delay line controller and the second delay line controller, in response to a monitor detection signal corresponding to clock skew between the reference clock and a feedback clock;
    a first phase detector configured to detect the first phase difference value between the reference clock and the feedback clock;
    a second phase detector configured to detect the second phase difference value between the reference clock and the feedback clock;
    a clock path configured to receive the second delayed clock and configured to generate an internal clock;
    an output buffer configured to synchronize with the internal clock to output a data strobe signal;
    a clock path replica configured to delay the second delayed clock by a delay amount equal to a delay amount of the clock path; and
    an output buffer replica configured to delay a clock output from the clock path replica by a delay amount equal to a delay amount of the output buffer, to generate the feedback clock.

2. The memory device of claim 1, wherein the first phase detector and the second phase detector are activated complementarily to each other.

3. The memory device of claim 1, further comprising a delay locked loop controller configured to generate a first activation signal for activating the first phase detector and a second activation signal for activating the second phase detector.

4. The memory device of claim 1, wherein, in an initial lock period, a coarse locking operation is performed by activating the first phase detector, and a fine locking operation is performed by activating the second phase detector after the coarse locking operation.

5. The memory device of claim 4, wherein the second phase detector maintains the activated state, after the fine locking operation is performed.

6. The memory device of claim 1, further comprising a window detection circuit configured to detect the clock skew between the reference clock and the feedback clock to generate the monitor detection signal.

7. The memory device of claim 6, wherein the window detection circuit is activated in response to an internal voltage stabilization signal.

8. The memory device of claim 6, wherein the window detection circuit comprises:
   a clock skew monitor configured to generate a phase detection signal corresponding to the clock skew between the reference clock and the feedback clock;
   a clock synchronization circuit configured to synchronize the phase detection signal with an internal clock to generate a synchronized phase detection signal; and
   a monitor detection signal generator configured to generate the monitor detection signal in response to the synchronized phase detection signal.

9. The memory device of claim 8, wherein the clock skew monitor is activated in response to an internal voltage stabilization signal.

10. The memory device of claim 1, wherein the clock skew monitor is forcibly deactivated by a test mode register set (TMRS).

11. A clock locking method of a memory device, comprising:
    performing an initial locking operation in a delay locked loop circuit before an internal voltage is stabilized;
    monitoring clock skew between a reference clock and a feedback clock using a window detection circuit after the internal voltage is stabilized; and
    performing a re-locking operation in the delay locked loop circuit using a dynamic delay control corresponding to the clock skew.

12. The clock locking method of claim 11, wherein the performing an initial locking operation, comprises:
    performing a first coarse locking operation by delaying the reference clock by a first delay line; and
    performing a first fine operation by delaying a clock, delayed by the first delay line through a second delay line.

13. The clock locking method of claim 12, further comprising:
    deactivating a first phase detector after the performing the first coarse locking operation; and
    maintaining an activated state of a second phase detector after the performing the first fine locking operation.

14. The clock locking method of claim 11, further comprising, receiving an internal voltage stabilization signal in the delay locked loop circuit when the internal voltage is stabilized.

15. The clock locking method of claim 14, wherein the performing a re-locking operation, comprises:
    receiving a monitor detection signal corresponding to the clock skew in the delay locked loop circuit after the receiving the internal voltage stabilization signal; and
    performing a second coarse locking operation by delaying the reference clock by a first delay line in response to the monitor detection signal.

16. A memory device comprising:
    a memory cell array having a plurality of memory cells in which a plurality of word lines and a plurality of bit lines intersect;
    a row decoder configured to select one of the plurality of word lines in response to a row address;
    a bit line detection amplifier circuit configured to detect and amplify data from memory cells connected to selected bit lines, among the plurality of bit lines, during a read operation;
    a column decoder configured to select the selected bit lines, among the plurality of bit lines, in response to a column address;
    a data input/output device configured to receive data from the bit line detection amplifier circuit during the read operation, and to output the received data to an external device in response to a data strobe signal synchronized with an internal clock;
    a delay locked loop circuit configured to receive a reference clock and to generate the internal clock; and
    a window detection circuit configured to generate a monitor detection signal corresponding to clock skew between the reference clock and a feedback clock, wherein the window detection circuit is activated in response to an internal voltage stabilization signal.

17. The memory device of claim 16, wherein the delay locked loop circuit comprises:
    a first delay line configured to delay the reference clock according to a first code value to output a first delayed clock;
    a second delay line configured to delay the first delayed clock according to a second code value to output a second delayed clock;
    a first delay line controller configured to generate the first code value according to a first phase difference value or to generate the first code value according to a second phase difference value;
    a second delay line controller configured to generate the second code value according to the second phase difference value;
    a de-multiplexer configured to output the second phase difference value to one of the first delay line controller and the second delay line controller, in response to the monitor detection signal;
    a first phase detector configured to detect the first phase difference value between the reference clock and the feedback clock;
    a second phase detector configured to detect the second phase difference value between the reference clock and the feedback clock;
    a clock path replica configured to delay the second delayed clock by a delay amount of a clock path; and
    an output buffer replica configured to delay a clock output from the clock path replica by a delay amount of an output buffer, to generate the feedback clock.

18. The memory device of claim 17, further comprising a delay locked loop controller configured to generate a first activation signal activating the first phase detector and to generate a second activation signal activating the second phase detector.

19. The memory device of claim 16, wherein the delay locked loop circuit is configured to perform dynamic delay control in response to the monitor detection signal.

* * * * *